US008463944B2

(12) United States Patent  (10) Patent No.: US 8,463,944 B2
Bansal et al.  (45) Date of Patent: Jun. 11, 2013

(54) OPTIMAL COMPRESSION PROCESS SELECTION METHODS

(75) Inventors: Ravi P Bansal, Tampa, FL (US); Andrew R. Jones, Round Rock, TX (US); Brian M. O'Connell, Research Triangle Park, NC (US); Keith R. Walker, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 12/652,361

(22) Filed: Jan. 5, 2010

(65) Prior Publication Data

US 2011/0167173 A1  Jul. 7, 2011

(51) Int. Cl.
*G06F 15/16* (2006.01)
(52) U.S. Cl.
USPC ........... 709/248; 709/229; 709/247; 382/232; 382/239; 370/202
(58) Field of Classification Search
USPC ................. 709/247; 382/232–239; 370/202
See application file for complete search history.

(56) References Cited

U.S. PATENT DOCUMENTS

| | | | | |
|---|---|---|---|---|
| 5,828,848 | A * | 10/1998 | MacCormack et al. | 709/247 |
| 5,838,821 | A * | 11/1998 | Matsubara et al. | 382/190 |
| 6,480,880 | B2 | 11/2002 | White et al. | |
| 6,523,102 | B1 * | 2/2003 | Dye et al. | 711/170 |
| 6,944,357 | B2 * | 9/2005 | Bossut et al. | 382/298 |
| 7,050,639 | B1 * | 5/2006 | Barnes et al. | 382/239 |
| 7,197,189 | B2 * | 3/2007 | Adelmann | 382/239 |
| 7,243,110 | B2 | 7/2007 | Grondin et al. | |
| 7,246,177 | B2 * | 7/2007 | Anton et al. | 709/247 |
| 7,299,300 | B2 * | 11/2007 | Desai et al. | 709/247 |
| 7,417,943 | B2 * | 8/2008 | Mutch | 370/202 |
| 8,046,496 | B1 * | 10/2011 | Nucci et al. | 709/247 |
| 2002/0101367 | A1 * | 8/2002 | Geiger et al. | 341/51 |
| 2003/0007695 | A1 * | 1/2003 | Bossut et al. | 382/239 |
| 2005/0131990 | A1 * | 6/2005 | Jewell | 709/201 |
| 2005/0210054 | A1 | 9/2005 | Harris | |
| 2005/0273245 | A1 * | 12/2005 | Chen et al. | 701/111 |

(Continued)

OTHER PUBLICATIONS

Zirkind, "AFIS Data Compression: an Example of How Domain Specific compression Algorithms Can Produce Very High Compression Ratios", ACM SIGSOFT Software Engineering Notes, Nov. 2007, vol. 32, No. 6, pp. 1-26.

(Continued)

*Primary Examiner* — Wing F Chan
*Assistant Examiner* — Razu Miah
(74) *Attorney, Agent, or Firm* — Yee & Associates, P.C.; Arthur Samodovitz

(57) ABSTRACT

A mechanism for determining an optimal compression technique for each data file when creating a computer archive file from a set of data files. A local archiving application receives an instruction to archive a set of data files and determines the file type and size of a data file in the set of data files. An optimal compression method for the data file is selected based on the file type and size of the data file. The archiving application compresses the data file using the optimal compression method. The archiving application updates meta data associated with the compressed file to include a meta compression format identifier of the optimal compression method used to compress the data file. The archiving application then repeats the determining, selecting, compressing, and updating for each data file in the set of data files to create an archive of the set of data files.

14 Claims, 9 Drawing Sheets

U.S. PATENT DOCUMENTS

| | | | |
|---|---|---|---|
| 2006/0117268 A1* | 6/2006 | Talley et al. | 715/769 |
| 2006/0181442 A1* | 8/2006 | Fallon | 341/87 |
| 2007/0109155 A1* | 5/2007 | Fallon | 341/50 |
| 2007/0206874 A1* | 9/2007 | Lee et al. | 382/239 |
| 2007/0230829 A1* | 10/2007 | Sirohey et al. | 382/299 |
| 2007/0276951 A1* | 11/2007 | Riggs et al. | 709/229 |
| 2008/0037880 A1* | 2/2008 | Lai | 382/232 |
| 2008/0050025 A1* | 2/2008 | Bashyam et al. | 382/238 |
| 2008/0209073 A1* | 8/2008 | Tang | 709/247 |
| 2008/0317116 A1* | 12/2008 | Lee et al. | 375/240.01 |
| 2009/0046777 A1* | 2/2009 | Kitamura | 375/240.02 |
| 2010/0188977 A1* | 7/2010 | Rochon et al. | 370/235 |
| 2010/0223237 A1* | 9/2010 | Mishra et al. | 707/693 |
| 2010/0274926 A1* | 10/2010 | Marulkar | 709/247 |

OTHER PUBLICATIONS

Zirkind, "AFIS Data Compression: an Example of How Domain Specific compression Algorithms Can Produce Very High Compression Ratios", ACM SIGSOFT Software Engineering Notes, Dec. 2007, vol. 41, No. 4, pp. 1-26 http://www.siggraph.org/publications/newsletter/volume-41-number-4/afis-data-compression.

* cited by examiner

| FILE TYPE | FILE SIZE RANGE | DECISION |
|---|---|---|
| JAVA SOURCE FILE | 0 <> 2000 KB | IF TYPE IS JAVA SOURCE AND SIZE IS LESS THAN 2000 KB, USE BZIP -FASTEST, ELSE USE ZIP -BEST |
| WAV AUDIO FILE | > 5000 KB | IF TYPE IS WAV AUDIO, USE FLAC |
| TEXT FILE | > 50 KB | IF TYPE IS TEXT, USE GZIP |
| ⋮ | ⋮ | ⋮ |

*FIG. 5A*

| FILE NAME | FILE SIZE | SELECTED METHOD |
|---|---|---|
| Startup.java | 50 KB | BZIP --FASTEST |
| Hello.wav | 20 MB | FLAC (FREE LOSSLESS AUDIO CODEC) |
| Readme.txt | 1 MB | GZIP |
| ⋮ | ⋮ | ⋮ |

OPTIMAL COMPRESSION PROCESS SELECTION METHODS

BACKGROUND

1. Field

The disclosure relates generally to data processing systems and in particular to file compression. Still more particularly, the disclosure relates to a computer implemented method, apparatus, and computer program code for determining an optimal compression technique for each data file when creating a computer archive file from a set of data files.

2. Description of the Related Art

In a computer system or data storage device, data storage is a limited resource. Therefore, software applications and other data storage users typically use data storage in a way that conserves drive space. Devices with relatively small amounts of data storage space, such as personal digital assistants (PDA) or cellular/wireless phones, are particularly sensitive to data storage usage. Similarly, data storage in data centers, such as in network attached storage devices, storage area networks, etc. requires file size reductions to reduce costs associated with adding and maintaining storage.

One popular way of conserving data storage space is file compression, in which a data file is compressed so that the compressed file is smaller than the original file. The compressed form of the file is then stored instead of the original file to conserve data storage. The ability to compress computer data provides great benefits in the areas of storage reduction and network bandwidth reduction. Reducing the size of a file before it is stored on a medium (disk, tape, other) can drastically reduce the cost of the storage solution required by a customer. Reducing the size of a file before it is distributed over a network may reduce not only the required bandwidth, but it may also increase the speed at which data can be distributed over the network. Traditionally, archive files are created which contain multiple, compressed files which are then stored or sent over a network.

SUMMARY

According to one embodiment of the present invention, a computer implemented method, apparatus, and computer program code are provided for determining an optimal compression technique for each data file when creating a computer archive file from a set of data files. A local archiving application receives an instruction to archive a set of data files and determines the file type and file size of a data file in the set of data files. An optimal compression method for the data file is selected based on the file type and file size of the data file. The local archiving application compresses the data file using the optimal compression method determined. The local archiving application updates meta data associated with the compressed file to include a meta compression format identifier of the optimal compression method used to compress the data file to form a compressed data file. The local archiving application then repeats the determining, selecting, compressing, and updating for each data file in the set of data files to create an archive of the set of data files.

BRIEF DESCRIPTION OF THE SEVERAL VIEWS OF THE DRAWINGS

FIG. 5A is an example configuration file comprising historical compression data in accordance with the illustrative embodiments;

FIG. 5B is example meta data comprising information about the compressed data files in accordance with the illustrative embodiments;

DETAILED DESCRIPTION

Figure 1:
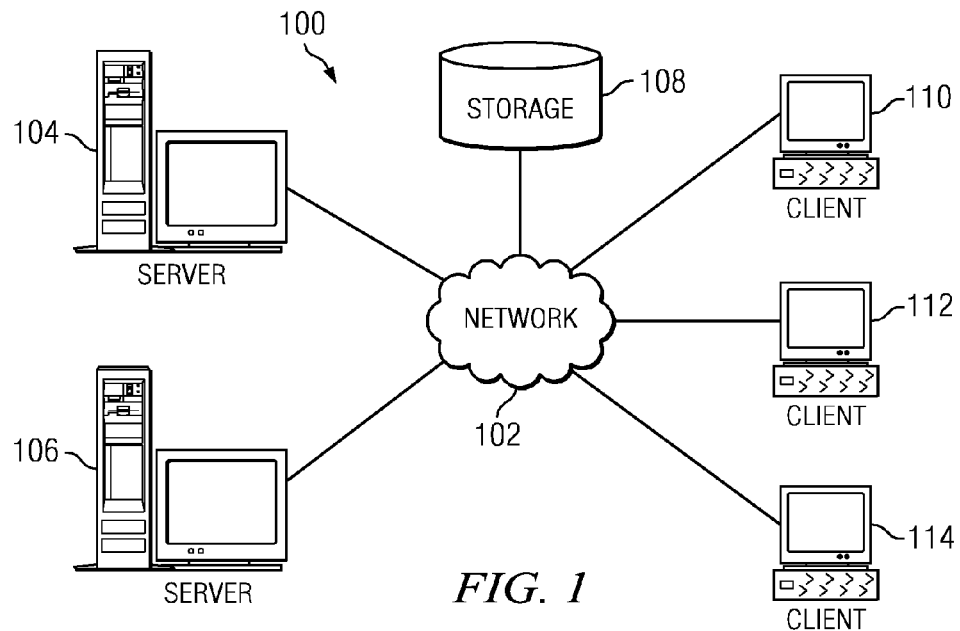
FIG. 1 depicts a pictorial representation of a network of data processing systems in which the illustrative embodiments may be implemented.

As will be appreciated by one skilled in the art, aspects of the disclosure may be embodied as a system, method or computer program product. Accordingly, aspects of the disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosure may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, or semiconductor system, apparatus, or device. More specific examples (a non-exhaustive list) of the computer-readable medium would include the following: a portable computer diskette, a hard disk, a random access memory (RAM), a read-only memory (ROM), an erasable programmable read-only memory (EPROM or Flash memory), a portable compact disc read-only memory (CDROM), an optical storage device, or a magnetic storage device. In the context of this document, a computer-usable or computer-readable medium may be any medium that can store the program for use by or in connection with the instruction execution system, apparatus, or device. The computer usable program code may be transmitted using any appropriate medium, including but not limited to wireless, wireline, optical fiber cable, RF, etc.

Computer program code for carrying out operations of the aspects of the disclosure may be written in any combination of one or more programming languages, including an object oriented programming language such as Java, Smalltalk, C++, Voice eXtensible Markup Language (VXML) or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The aspects of the disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 2:
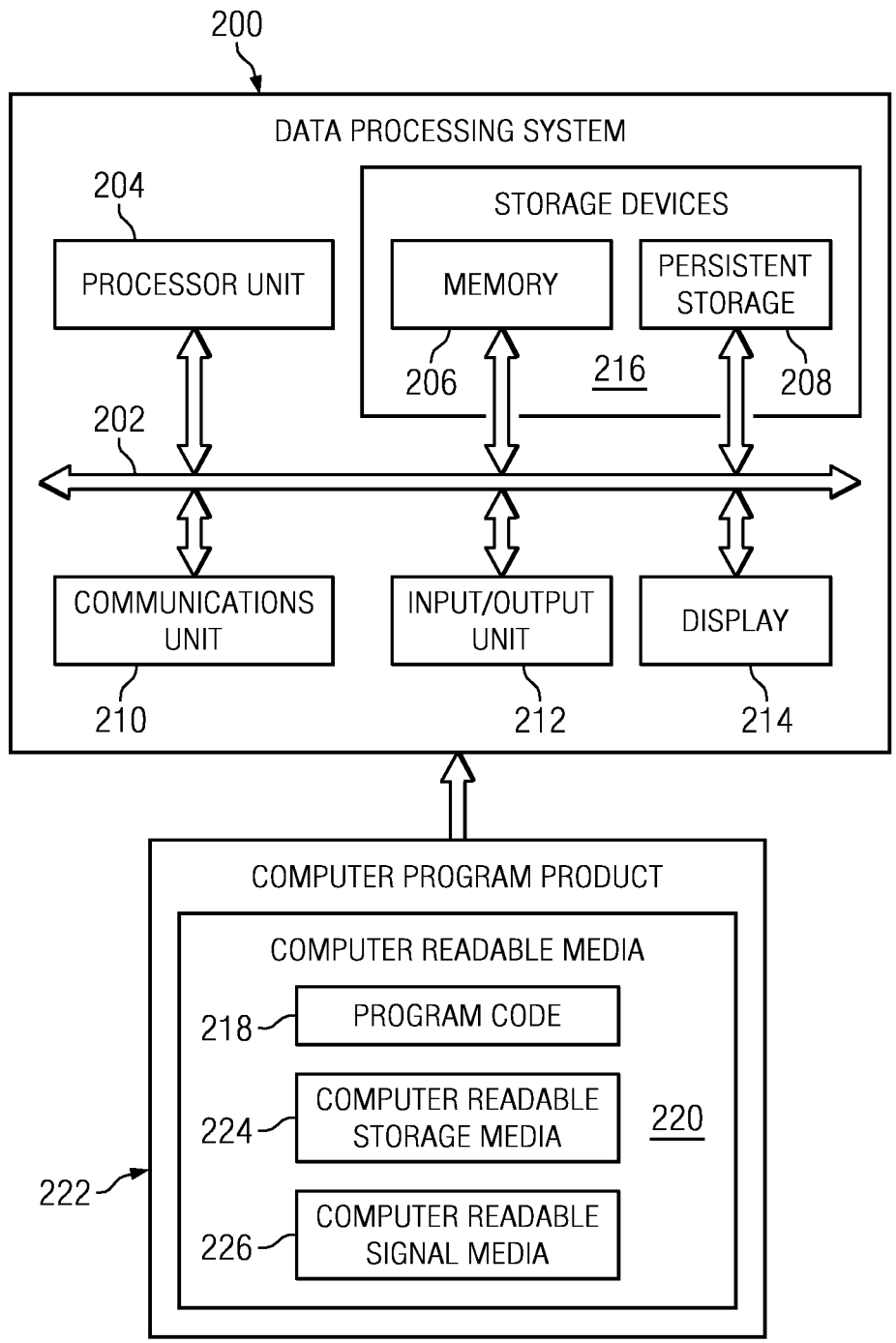
FIG. 2 is a block diagram of a data processing system in which the illustrative embodiments may be implemented.

With reference now to the figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a network of data processing systems in which illustrative embodiments may be implemented. Network data processing system 100 is a network of computers in which the illustrative embodiments may be implemented. Network data processing system 100 contains network 102, which is the medium used to provide communications links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides information, such as boot files, operating system images, and applications to clients 110, 112, and 114. Clients 110, 112, and 114 are clients to server 104 in this example. Network data processing system 100 may include additional servers, clients, and other devices not shown.

Program code located in network data processing system 100 may be stored on a computer recordable storage medium and downloaded to a data processing system or other device for use. For example, program code may be stored on a computer recordable storage medium on server 104 and downloaded to client 110 over network 102 for use on client 110.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of a data processing system is depicted in accordance with an illustrative embodiment. Data processing system 200 is an example of a computer, such as server 104 or client 110 in FIG. 1, in which computer usable program code or instructions implementing the processes may be located for the illustrative embodiments. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems, in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example, without limitation, data, program code in functional form, and/or other suitable information either on a temporary basis and/or a permanent basis. Memory 206, in these examples, may be, for example, a random access memory, or any other suitable volatile or non-volatile storage device. Persistent storage 208 may take various forms, depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 may be removable. For example, a removable hard drive may be used for persistent storage 208.

Communications unit 210, in these examples, provides for communication with other data processing systems or devices. In these examples, communications unit 210 is a network interface card. Communications unit 210 may provide communications through the use of either or both physical and wireless communications links.

Input/output unit 212 allows for the input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications, and/or programs may be located in storage devices 216, which are in communication with processor unit 204 through communications fabric 202. In these illustrative examples, the instructions are in a functional form on persistent storage 208. These instructions may be loaded into memory 206 for execution by processor unit 204. The processes of the different embodiments may be performed by processor unit 204 using computer implemented instructions, which may be located in a memory, such as memory 206.

These instructions are referred to as program code, computer usable program code, or computer readable program code that may be read and executed by a processor in processor unit 204. The program code, in the different embodiments, may be embodied on different physical or computer readable storage media, such as memory 206 or persistent storage 208.

Program code 218 is located in a functional form on computer readable media 220 that is selectively removable and may be loaded onto or transferred to data processing system 200 for execution by processor unit 204. Program code 218 and computer readable storage media 224 form computer program product 222. In one example, computer readable media 220 may be computer readable storage media 224 or computer readable signal media 226. Computer readable storage media 224 may include, for example, an optical or magnetic disc that is inserted or placed into a drive or other device that is part of persistent storage 208 for transfer onto a storage device, such as a hard drive, that is part of persistent storage 208. Computer readable storage media 224 also may take the form of a persistent storage, such as a hard drive, a thumb drive, or a flash memory that is connected to data processing system 200. In some instances, computer readable storage media 224 may not be removable from data processing system 200.

Alternatively, program code 218 may be transferred to data processing system 200 using computer readable signal media 226. Computer readable signal media 226 may be, for example, a propagated data signal containing program code 218. For example, computer readable signal media 226 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative embodiments, program code 218 may be downloaded over a network to persistent storage 208 from another device or data processing system through computer readable signal media 226 for use within data processing system 200. For instance, program code stored in a computer readable storage media in a server data processing system may be downloaded over a network from the server to data processing system 200. The data processing system providing program code 218 may be a server computer, a client computer, or some other device capable of storing and transmitting program code 218.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. The different embodiments may be implemented using any hardware device or system capable of executing program code. As one example, data processing system 200 may include organic components integrated with inorganic components and/or may be comprised entirely of organic components excluding a human being. For example, a storage device may be comprised of an organic semiconductor.

As another example, a storage device in data processing system 200 is any hardware apparatus that may store data. Memory 206, persistent storage 208, and computer readable media 220 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

Many different compression utilities are currently available to compress files when there is a need to conserve memory. Some traditional compression schemes and methods include ZIP, RAR, bzip2, lzma, among many others. Each compression utility uses one or more techniques, or methods, for compressing a file. While there are many utilities in existence that can create archive files that contain compressed data (files), the archive utilities tend to employ only a limited set of compression methods and do not provide the optimal compression for each file in a set of files to be archived. For instance, the ZIP file format is a data compression and archival format. A .zip file contains one or more files that have been compressed to reduce their file size. A number of compression methods are permitted in .zip files, but to date only DEFLATE is widely used and supported. In another example, while the bzip2 file format compresses most files more effectively than the more traditional gzip or ZIP utilities, the compression process is slower than for gzip or ZIP. In addition, bzip2 may compress files less effectively than other compression utilities. As existing archive utilities typically employ a limited set of compression methods, traditional compression techniques do not allow the most optimal compression technique to be applied to each data file in a set of data files to be stored as an archive. By not using the most compression technique for each data file in the set of data files to be archived, compression of the files may require additional storage, network bandwidth, and distribution time. Similarly, even if a user individually compressed files according to knowledge of optimal compression techniques, there is currently no technique to display, manage, and decompress the files as if they were a single compressed file.

The illustrative embodiments provide a solution to the problem above by providing a technique for individually determining the optimal compression technique for each data file in a set of data files to be archived. An optimal compression technique for a file may comprise a compression method that provides the fastest compression time, the best compression (least amount of storage space required), or the least amount of bandwidth required, or any combination of these factors. The optimal compression technique determined to be applicable to a file may be based on the type of data in the file being compressed and, in some cases, also the size of the data file. Thus, if files of different types and sizes are being archived into an archive file, the illustrative embodiments may determine that different compression methods should be applied to the different file types and sizes to achieve optimal compression results for each data file. Consequently, the archive file comprising the compressed data files may be generated using different file compression techniques. Once the optimal compression technique is determined for each of the data files, each file in the set of data files may be compressed using its applicable optimal compression technique to store the set of files within a single archive. Various embodiments for determining compression techniques are described herein and include compression selection based on using a pre-programmed static historical decision table, a shared information service, and an exhaustive local search. These embodiments may be used in conjunction or independently. Use of the illustrative embodiments allow for increased compression ratios for archive files, which may lead to reductions in storage and network bandwidth costs and increases in network delivery times for large archives.

Figure 3:
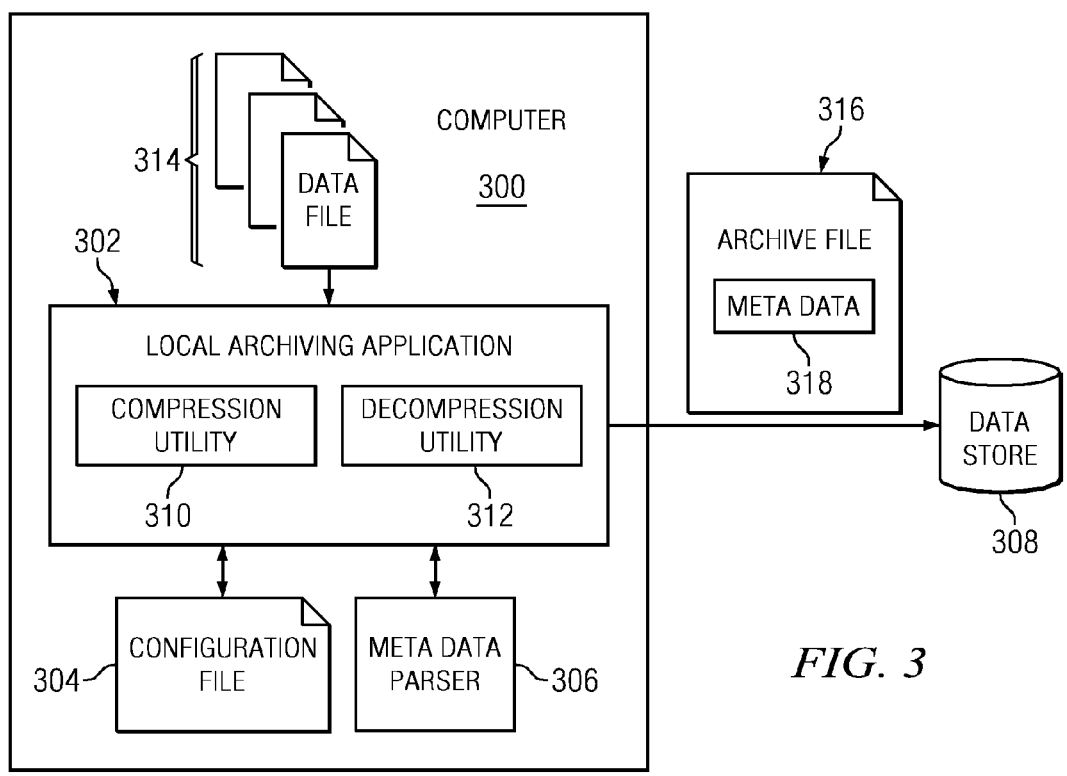
FIG. 3 is a block diagram of exemplary components in a data processing system used to implement an embodiment of the disclosure.

Turning now to FIG. 3, a block diagram of exemplary components in a data processing system used to implement an embodiment of compression selection based on using a pre-programmed static historical decision table is shown. Computer 300 is an example of data processing system 200 in FIG. 2. Computer 300 comprises local archiving application 302, configuration file 304, meta data parser 306, and data store 308. However, it should be noted that computer 300 is only meant as an example and not intended as a limitation on different illustrative embodiments. In other words, computer 300 may include more or fewer components as necessary to accomplish processes of the illustrative embodiments.

Local archiving application 302 comprises a software application that archives multiple data files 314 into a single archive file 316 by compressing and reducing the number of binary digits required to represent the data. An archive file in this disclosure is a file that is composed of one or more compressed files together with meta data 318 about the compressed files. Meta data 318 in archive file 316 may comprise known information, such as source volume and medium information, file directory structure, modification time, ownership of the file, and file comments, among others. In the illustrative embodiments, local archiving application 302 is modified to include additional meta data that specifies the compression format of a data file, or meta compression format (MCF). The meta compression format of a data file is the compression method by which that data file was compressed. The meta data itself may be compressed using a standard method (bzip2, gzip, etc.) and stored as part of the created archive.

Local archiving application 302 provides for creating an archive file in which data files in the archive may be compressed using different compression methods, such as bzip2, ZIP, gnu-zip, FLAC, etc. Local archiving application 302 comprises a compression utility 310 and decompression utility 312. Compression utility 310 is used to compress a set of data files into a single archive file. To compress a set of data files, local archiving application 302 examines each data file in the set of files to determine the type and the size of each file. A file type is the format in which the file is stored in the data processing system. The file size reflects the amount of disk space the file uses in the particular file system of computer device 300. Any known technique for determining the type of a file may be used to obtain the file type. One popular method in use by several operating systems is to determine the type of a file based on the filename extension. For example, HTML documents are identified by names that end with .html (or .htm), and GIF images by .gif. In another example, the file type may be determined based on information inside the file itself. Such information is often written in one or more binary string(s), tagged, or raw texts placed in the file header. In a further example, a UNIX® "file" command may be used to determine the file type for a specified file. UNIX is a registered trademark of The Open Group in the United States and other countries. Similarly, any known technique for determining the size of a file may be used to obtain the file size, such as the UNIX "file size" command. Regardless of the method for determining the file type and size of each data file in the set of files to be archived, local archiving application 302 uses the file type and size information to query configuration file 304. Local archiving application 302 looks up the optimal compression method in configuration file 304 to apply to the data file based on the type and size of the data file.

Configuration file 304 comprises historical information of compressions performed previously on data files. In one embodiment, configuration file 304 comprises preprogrammed static decision tables specifying attributes of the previously compressed files, including file name, type, and size, and the compression methods used to compress each data file. Configuration file 304 may be, for example, an .xml file, .ini file, or .properties file, among others, or may be stored in a data repository, such as in a database, embedded in the application code, in an operating system registry, or in an operating system environment variable. Configuration file 304 may be specific to the local environment where local archiving application 302 is run, such that the configuration files on systems with different operating systems, processors, memory amounts, drive types, and the like may be different according to different optimal compression methods based on such environments.

To determine the optimal compression method for the data file to be archived, local archiving application 302 locates an entry in configuration file 304 that matches the file type (and size) of the data file to be archived. The entry in the table also comprises a field that specifies the optimal compression method to be used on data files of the same type (and size). For example, configuration file 304 may specify that if the data file is a .java file type, the bzip2 compression method that was previously determined to provide optimal compression results for a similar data file type (and size) should be applied to the current data file to produce optimal compression results Likewise, configuration file 304 may specify that if the data file is a .txt file type, the gzip compression method determined previously to provide optimal compression results for a similar data file should be applied to the current data file.

Compression utility 310 is a tool for compressing multiple data files into a single archive file. Local archiving application 302 invokes compression utility 310 which compresses each data file using the optimal compression method specified in the corresponding configuration file entry for each file to create archive file 316. Archive file 316 may be stored in data store 308, computer 300, or in a local file system. Local archiving application 302 also updates meta data 318 in archive file 316 with the compression method used to compress each data file. The meta compression format in meta data 318 is updated to include the name or other identifier of the compression method used. It should be noted that compression and decompression utilities employing the meta compression format must use the same identifier scheme in order to be able to parse the archives and to prevent using an incompatible decompression method. The compression method used to compress the file is stored in meta data 318 to enable local archiving application 302 and decompression utility 312 to determine from meta data 318 which method to use to decompress the file at a later time.

Decompression utility 312 is a tool for reversing the compression and returning a set of compressed files to their original uncompressed state. As with any communication, compressed data communication only works when both the sender and receiver of the information understand the encoding scheme. Thus, compressed data can only be understood if the compression method can be discovered by decompression utility 312. With this in mind, decompression utility 312 may decompress archive file 316 by using meta data parser 306 to examine meta data 318 of each compressed file. Meta data parser 306 is a utility that parses meta data 318 stored within archive file 316 to determine if the meta compression format specifies the existence of the name or identifier of compression methods that were used to compress each of the data files comprising archive file 316. If no meta compression format identifier is found, the current method of decompression may be used to decompress archive file 316. However, if the meta compression format comprises a compression method identifier, decompression utility 312 may decompress each data file based on the corresponding compression method used to compress the data file.

Figure 4:
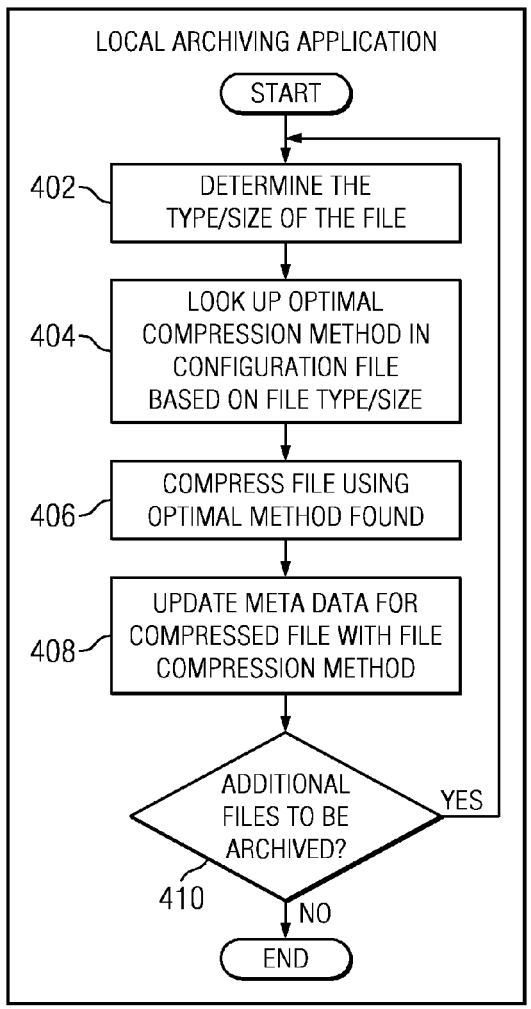
FIG. 4 is a flowchart of a basic archive process implemented locally by an archive application for compressing a set of files into an archive file in accordance with the illustrative embodiments.

FIG. 4 is a flowchart of a basic archive process implemented locally by an archive application for compressing a set of files into an archive file in accordance with the illustrative embodiments. The archive process described in FIG. 4 may be implemented in computer 300 in FIG. 3. Specifically, the process is performed by local archiving application 302 in FIG. 3 on each data file in the set of data files to be stored as a single archive.

When an instruction is received by the local archiving application to archive a set of data files, the process begins with the local archiving application determining the type and the size of a first data file in the set of files (step 402). Once the type and size of the data file has been determined, the local archiving application looks up the optimal compression method for data files of the same type and size to apply to the data file (step 404). The local archiving application may look up the best compression method for the data file based on preprogrammed static historical compression information stored in a configuration file. The local archiving application locates an entry in the configuration file that corresponds to the file type of the data file being archived and uses the compression method specified in the entry to apply to the data file based on the file type and file size.

The local archiving application then compresses the data file using the optimal compression method located in the configuration file (step 406). The local archiving application also updates the meta data for the compressed data file in the archive file by specifying the compression method used to compress the data file (step 408).

A determination is then made by the local archiving application as to whether there are any more data files in the set of files to be archived (step 410). If the local archiving application determines that there are more data files in the set to be archived ('yes' output of step 410), the process returns to step 402 to determine the file type and size of the next data file to be archived. If all data files in the set have been archived ('no' output of step 410), the process terminates thereafter.

FIG. 5A is an example configuration file comprising historical compression data in accordance with the illustrative embodiments. Configuration file 500 is an example of configuration file 304 in FIG. 3 and comprises file attributes and rules used by the local archiving application. The local archiving application looks up historical compression information in configuration file 500 that matches the file type (and file size in some cases) of each data file in a set of files to be archived in order to determine the optimal compression method to apply to that particular data file. Thus, selection of the optimal compression method for an individual data file may be based on information observed and stored from previous compression processes.

In this illustrative example, configuration file 500 is a table comprising various fields, including file type 502, file size range 504, and decision 506. File type 502 specifies the type of a data file, and file size range 504 specifies a size range of the data file. Decision field 506 comprises rules for selecting a particular compression method the local archiving application should use when compressing a data file. For example, when the local archiving application looks within configuration file 500 to determine the optimal compression method to apply to a Java source file, the local archiving application checks decision field 506 in the entry where file type 502 comprises "Java source file". Java is a trademark of Sun Microsystems in the United States, other countries, or both. In this case, decision field 506 for entry 508 instructs the local archiving application that if the data file size is in a range of less than 2000 kb, the bzip compression method may be used to compress the file faster, while the ZIP compression method may be used to compress the file better. The local archiving application may determine which compression method to select from options provided in decision field 506 based on an application default setting or user input. For example, the archiving application may comprise a default setting of obtaining the best compression to achieve maximum file savings. In such a case, the local archiving application would select the ZIP compression method for example entry 508 above as the ZIP compression method compresses the file better than the bzip method. User input may also be obtained to instruct the local archiving application as to which compression method should be selected from options in decision field 506. Choices may be provided to the user on a per operation basis that enable the user to specify whether the archive should be created by compressing files with maximum speed, maximum file savings, or with a balance of speed and file savings.

FIG. 5B is example meta data comprising information about the compressed data files. Meta data 530 is an example of meta data 318 in FIG. 3 and comprises known information about the compressed files, such as source volume and medium information, file directory structure, modification time, ownership of the file, and file comments, among others. However, unlike conventional archiving systems, meta data 530 includes the meta compression format of each compressed data file. The meta compression format is used in the decompression process to determine the compression method by which that data file was compressed.

In this illustrative example, meta data 530 is a table comprising various fields, including file name 532, file size 534, and selected method 536. File name field 532 contains the name of a previously compressed data file (e.g., Startup.java) and attributes and compression selection rules associated with the data file. File name field 532 is provided to display to a user when the user views the enhanced archive. File size field 534 specifies the size of the named file. Selected method field 536 comprises the compression method selected for the previously compressed data file. Thus in this example, for entry 538 comprising Java source file "Startup.java", the bzip compression method was used to compress the Startup.java file in a time faster than possible by other compression methods. Similarly, the FLAC compression method was used to compress the .wav file "Hello.wav", and the gzip compression method was used to compress the .txt file "Readme.txt".

The content of configuration file 500 and meta data 530 may be utilized in the following manner. A set of data files are passed to the compression utility as a series of file names (e.g., Startup.java, Hello.wav, Readme.txt, etc.). The compression utility obtains the file size of one of the data files from the operating system and determines the file type from the file extension of the file name. Once the file type and size of the data file is known, the compression utility accesses configuration file 500 to lookup a record matching the file type and size in file type 502 and file size range 504, respectively, to determine the optimal compression method in decision 506 for the given file type and size. The compression utility then compresses the data file according to the method discovered in decision 506, and the result is a subset of the archive file (if the data set comprises multiple files for archiving). The optimal compression selected from decision 506 in configuration file 500 is then stored as a record in meta data 530. For example, the name of the data file is recorded in file name 532, the size is recorded in file size 534, and the selected compression method used is stored in selected method 536. Selected method 536 is a field additional to records existing in meta data 530, which currently includes file names, uncompressed sizes, compressed sizes, and the rest of the file information data that gets displayed when a user views the archive. While existing archiving systems do not use meta data 530 in the decompression process, the decompression process in the illustrative embodiments relies on meta data 530 to determine the format in which a data file was compressed. Selected method 536 may also be displayed to the user. If the selected method exists for the data file, the decompression utility will display the original file name in file name 502, such as Startup.java, and not the compressed file name, such as Startup.bzip.

Figure 6:
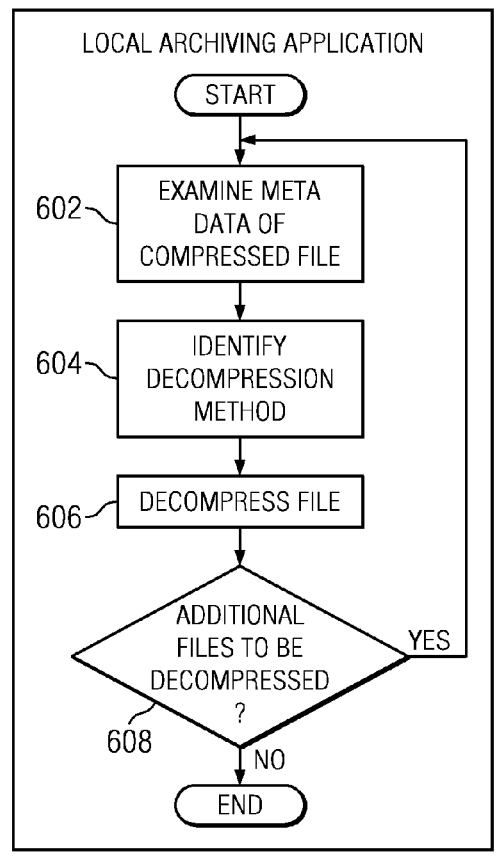
FIG. 6 is a flowchart of a process implemented by the archive application for decompressing a set of files in accordance with an illustrative embodiment.

FIG. 6 is a flowchart of a process implemented by the archive application for decompressing a set of files in accordance with an illustrative embodiment. The archive process described in FIG. 6 may be implemented in computer 300 in FIG. 3. Specifically, the process is performed by local archiving application 302 and decompression utility 312 in FIG. 3 on an archived file.

When an instruction is received to decompress an archived file, the process begins with the local archiving application examining the meta data of the compressed file in the archive file (step 602). The local archiving application examines the meta data to identify the compression method used to compress the data file (step 604). This compression method meta data may be set when the data file is being archived. The local archiving application then invokes the decompression utility to decompress the data file (step 606).

A determination is then made by the local archiving application as to whether there are any more data files in the set of files to be decompressed (step 608). If the local archiving application determines that there are more data files in the set to be decompressed ('yes' output of step 608), the process returns to step 602 to examine the meta data of the next compressed file in the archive file. If all data files in the set have been decompressed ('no' output of step 608), the process terminates thereafter.

Figure 7:
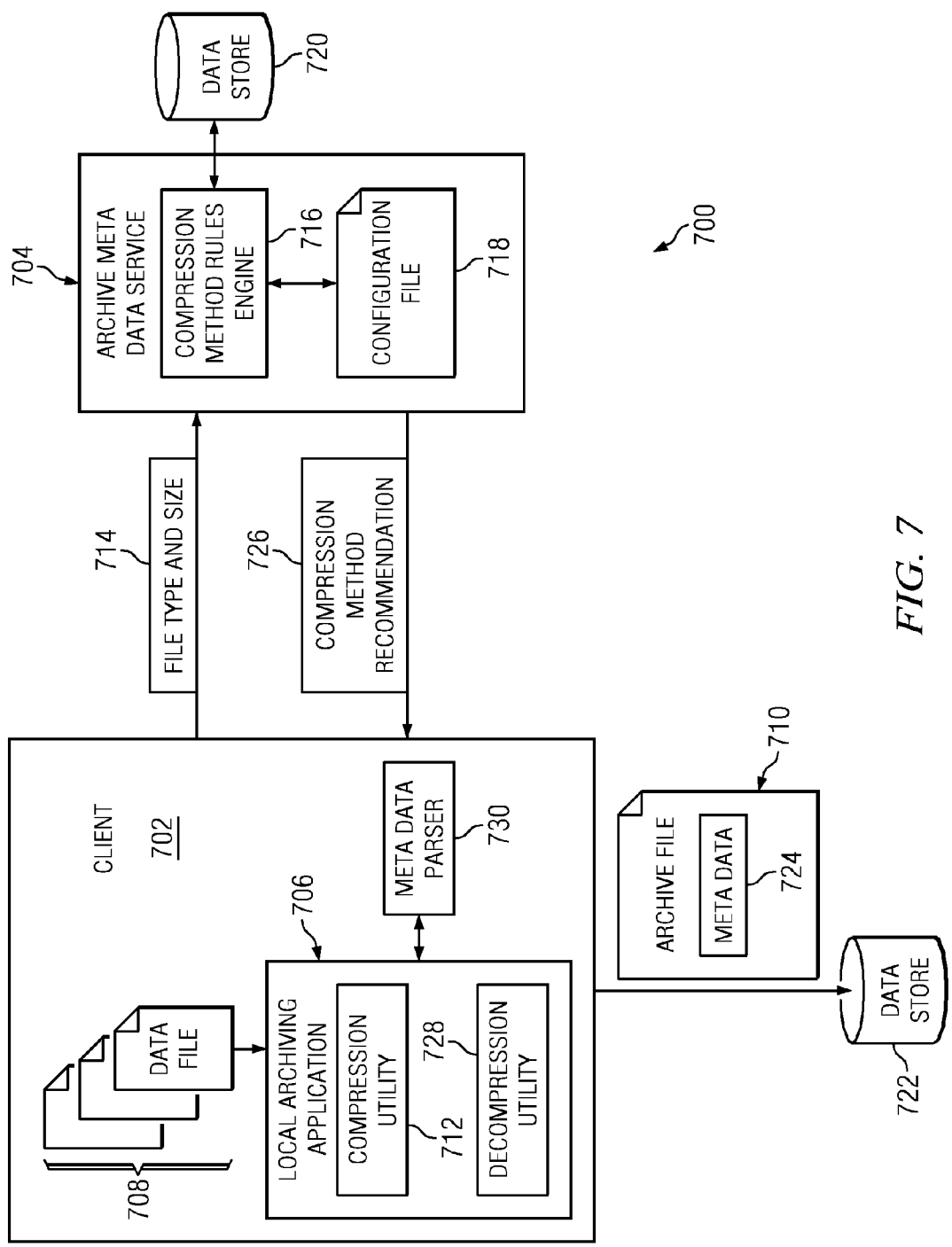
FIG. 7 is a block diagram of exemplary components in a distributed data processing system used to implement another embodiment of the disclosure.

FIG. 7 is a block diagram of exemplary components in a distributed data processing system used to implement another embodiment of the disclosure. Distributed data processing system 700 comprises client 702 and archive meta data service 704. Client 702 is an example of client device 110, 112, or 114 in FIG. 1. Archive meta data service 704 is an example of server 104 or 106 in FIG. 1. Client 702 and archive meta data service 704 may be connected via a network, such as network 102 in FIG. 1. It should be noted that distributed data processing system 700 is only meant as an example and not intended as a limitation on different illustrative embodiments. In other words, distributed data processing system 700 may include more or fewer components as necessary to accomplish processes of the illustrative embodiments.

In contrast with the embodiment depicted in FIG. 3 in which a device determines optimal compression methods to apply to each data file in a set of data files using static historical compression information stored locally in a configuration file, in this illustrative embodiment, a network or internet service is accessed by an archiving application to obtain, prior to compressing the data files, the most up-to-date historical compression information and compression formats available for each file type. Archive meta data service 704 is an example of such a service and may provide compression information and formats to multiple subscribing clients.

Client 702 comprises local archiving application 706, which is a software application that archives multiple data files 708 into an archive file 710 using compression utility 712. Local archiving application 706 employs compression utility 712 to compress each of the data files using a compression method optimal for each particular data file.

To compress data files 708, client 702 examines each data file in the set of files to determine the type and the size of each file. Any known technique for determining the type or size of a file may be used, such as the respective UNIX® "file" and "size" commands. Client 702 queries archive meta data service 704 for the latest optimal compression method for each data file in the set of data files 708 by sending the file type and size 714 to archive meta data service 704.

Archive meta data service 704 may comprise an internet service or other network service from which client 702 may obtain the most up-to-date historical compression information and compression formats available for each file type. Upon receiving the file type and size, archive meta data service 704 invokes compression method rules engine 716 to determine the optimal compression method to use for each data file in the file set. Compression method rules engine 716 uses the file type and size information to query configuration file 718. Similar to configuration file 304 in FIG. 3, configuration file 718 comprises historical information of compressions performed previously on data files and may be stored in a data repository, such as in a database, embedded in the application code, in an operating system registry, or in an operating system environment variable. However, configuration file 718 comprises historical compression information from a variety of client devices which may periodically upload their individual compression results to archive meta data service 704. Consequently, the historical compression information in configuration file 718 may comprise more current compression information than in configuration file 304 in FIG. 3.

Compression method rules engine 716 looks up the optimal compression method in configuration file 718 to apply to a data file based on the type and size of the data file. Compression method rules engine 716 locates an entry in configuration file 718 that matches the file type (and size) of the data file to be archived, which also specifies the optimal compression method to be used on data files of the same type (and size). Archive meta data service 704 responds to client 702 with an optimal compression method recommendation 726 to be used on the particular data file.

Archive meta data service 704 may also provide the recommended compression method to client 702 if client 702 determines, upon receiving the recommendation, that the recommended compression method does not exist on the client 702. Archive meta data service 704 may obtain the recommended optimal compression method from data store 720 and send the compression method to client 702.

Compression utility 712 compresses the multiple data files into a single archive file 710 using the respective compression methods recommended for each of the data files. Archive file 710 may be stored in data store 722, in client 702, or in a local file system. Client 702 also updates meta data 724 in archive file 710 with the compression method used to compress each data file. The compression method used to compress the file is stored in the meta data to enable the local archiving application to determine which method to use to decompress the file at a later time using decompression utility 728 and meta data parser 730.

Figure 8:
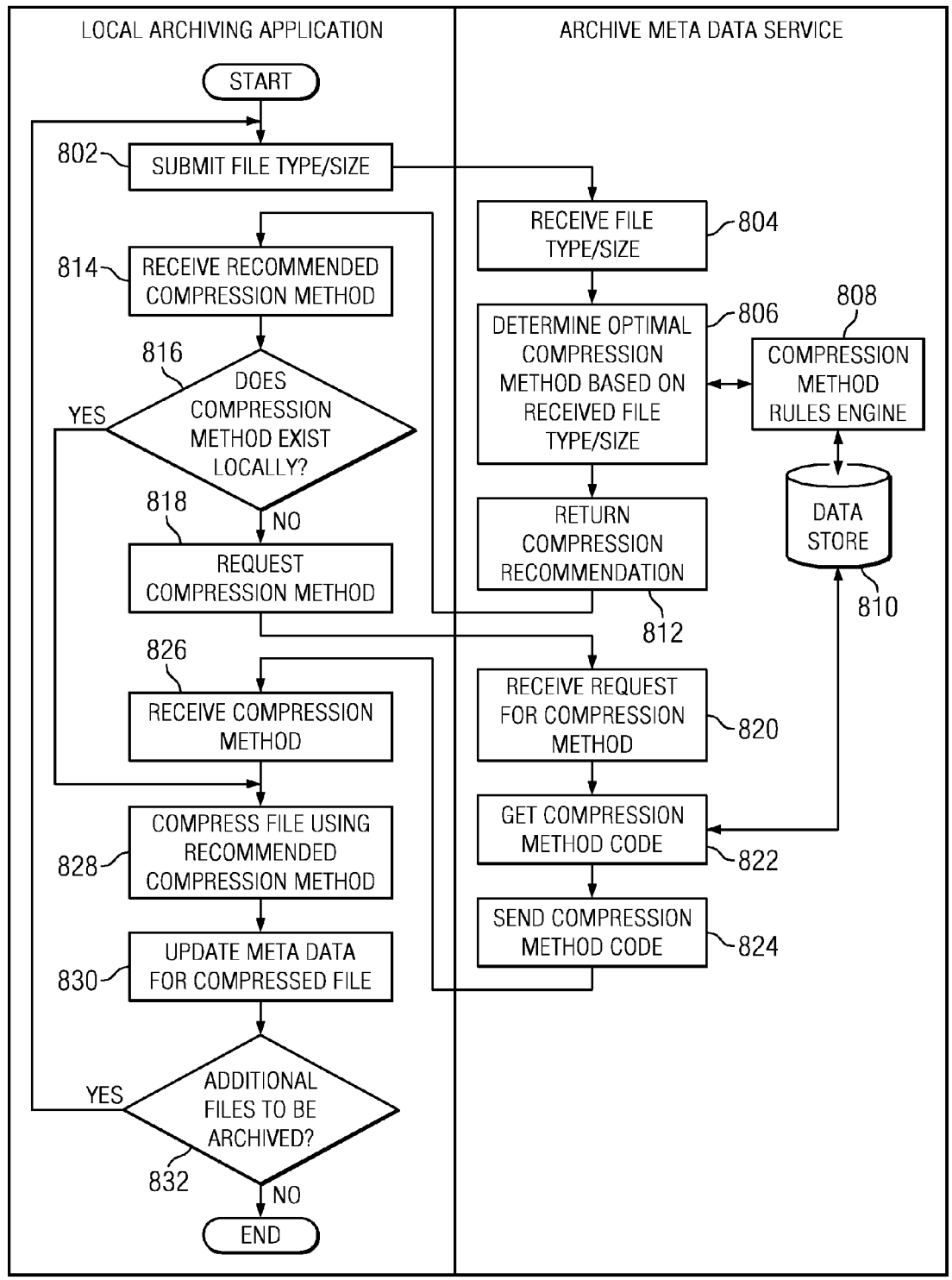
FIG. 8 is a flowchart of a distributed archive process implemented by an archive application and an external archive meta data service for compressing a set of data files into an archive file in accordance with the illustrative embodiments.

FIG. 8 is a flowchart of a distributed archive process implemented by an archive application and an external archive meta data service for compressing a set of data files into an archive file in accordance with the illustrative embodiments. The distributed archive process described in FIG. 8 may be implemented in data processing system 700 in FIG. 7. Aspects of the embodiment are performed by data processing system 700 in FIG. 7 on each file in the set of files to be stored as a single archive.

When an instruction is received to archive a set of files, the process begins with the local archiving application sending the file type and the file size to the archive meta data service (step 802). Upon receiving the file type and size, the archive meta data service (step 804), the archive meta data service determines the optimal compression method associated with the received file type and size (step 806). This determination may be made by a compression method rules engine that looks up the best compression method for the file (step 808) based on historical compression information stored in a configuration file or data store (step 810). The compression method rules engine locates an entry in the configuration file or data store that corresponds to the file type of the file being archived and selects the compression method to apply to the file based on the file type and the file size. The archive meta data service then returns the optimal compression method recommendation to the local archiving application (step 812).

When the local archiving application receives the optimal compression method recommendation (step 814), the local archiving application makes a determination whether the recommended compression method exists locally (step 816). If the recommended compression method exists locally ('yes' output of step 816), the process continues to step 828. However, if the recommended compression method does not exist locally ('no' output of step 816), the local archiving application sends a request for the compression method to the archive meta data service (step 818). The archive meta data service receives the request (step 820), obtains the requested compression method code (step 822), and sends the compression method code to the local archiving application (step 824). The local archiving application receives the compression method code (step 826).

At step 828, the local archiving application compresses the file using the recommended compression method. The local archiving application also updates the meta data for the compressed file with the compression method used to compress the file (step 830). A determination is then made by the local archiving application as to whether there are any more files in the set of files to be archived (step 832). If the local archiving application determines that there are more files in the set to be archived ('yes' output of step 832), the process returns to step 802 to send the file type and size of the next file to be archived. If all files in the set have been archived ('no' output of step 832), the process terminates thereafter.

Figure 9:
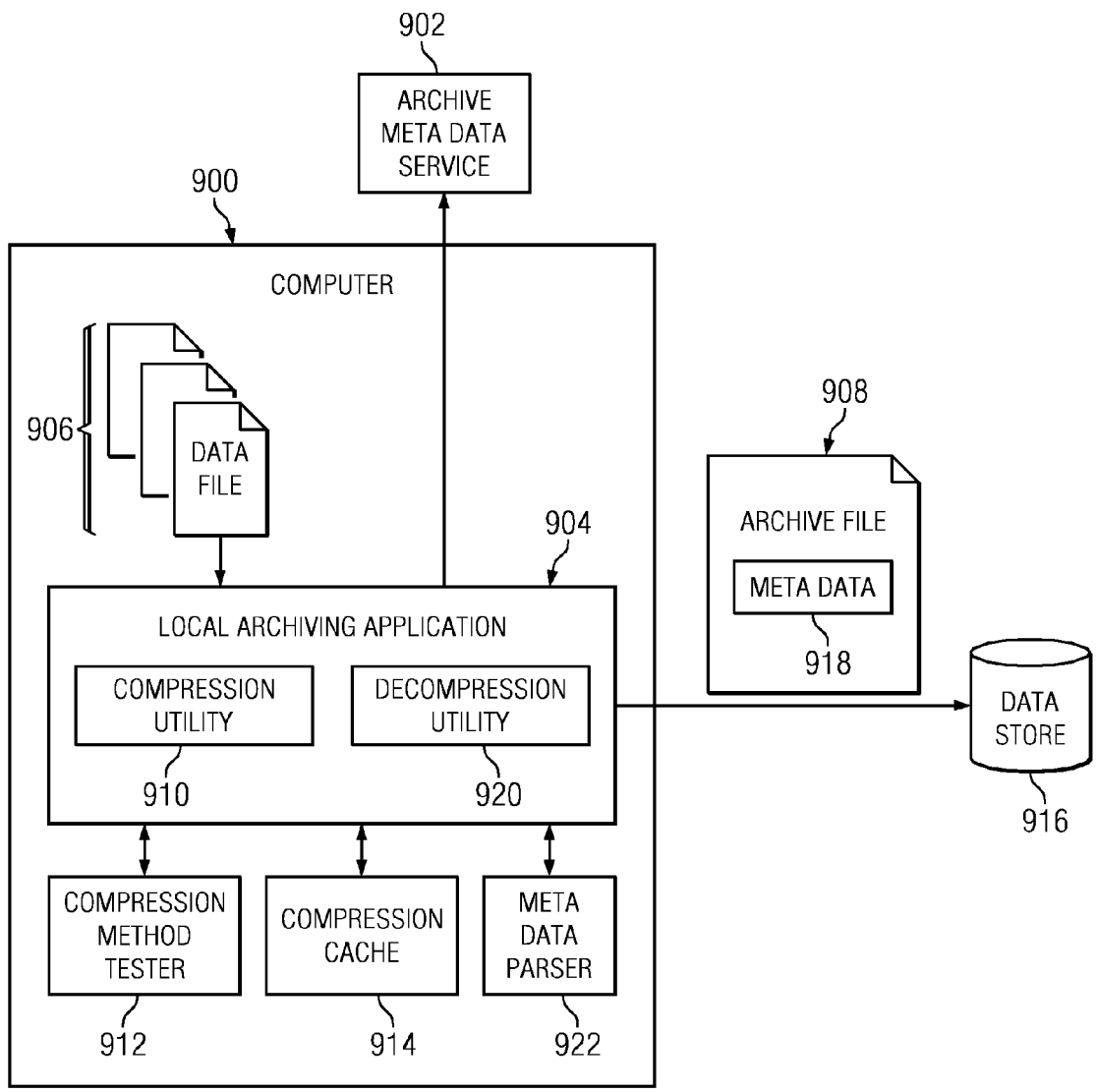
FIG. 9 is a block diagram of exemplary components in a data processing system used to implement another embodiment of the disclosure.

FIG. 9 is a block diagram of exemplary components in a data processing system used to implement another embodiment of the disclosure. Computer 900 is an example of data processing system 200 in FIG. 2. Archive meta data service 902 is an example of archive meta data service 704 in FIG. 7. Computer 900 and archive meta data service 902 may be connected via a network. It should be noted that computer 900 is only meant as an example and not intended as a limitation on different illustrative embodiments. Computer 900 may include more or fewer components as necessary to accomplish processes of the illustrative embodiments.

In contrast with the embodiment depicted in FIG. 3 in which a device determines optimal compression methods to apply to each file in a set of data files using static historical compression information stored locally in a configuration file and the embodiment in FIG. 7 in which a device determines optimal compression methods to apply to each file in a set of data files using historical compression information provided by an archive service, in this illustrative embodiment, a local archiving application performs an analysis of each file in the set of files to be archived using all available compression types to determine the best method for compressing each file. Thus, rather than using historical information obtained from prior compressions of files, the local archiving application itself performs an exhaustive compression analysis of each file during the archiving process to determine the optimal compression method to apply to the file.

Computer 900 comprises local archiving application 904, which is a software application that archives multiple data files 906 into an archive file 908 using compression utility 910. Archive file 908 may be stored in data store 916. Local archiving application 904 employs compression utility 910 to compress each of data files 906 using a compression method determined to be optimal for each particular data file in a set of files. Computer 900 also updates meta data 918 in archive file 908 with the compression method used to compress each data file. The compression method used to compress the file is stored in the meta data to enable the local archiving application to determine which method to use to decompress the file at a later time using decompression utility 920 and meta data parser 922.

In this illustrative embodiment, for each data file in the set of files 906, computer 900 uses compression method tester 912 to run each available compression method against the data file. Compression method tester 912 examines the results of each compression test for a data file and determines the compression method that provides the optimal compression results for that data file. Compression method tester 912 determines the optimal compression method for each data file in the set of data files 906. As previously mentioned, the optimal compression technique for a file may comprise a compression method that provides the fastest compression time, the best compression (least amount of storage space required), or the least amount of bandwidth required. Compression method tester 912 may employ any one or combination of these factors in determining the optimal compression method. Local archiving application 904 stores attributes about each data file and its associated optimal compression method in compression cache 914.

Compression cache 914 is a cache in which the local archiving application 904 stores a data file's attributes and the optimal compression method determined for the data file. Attributes about a data file may include the file name, file type, and file size, among others. Because the local exhaustive analysis employed by local archiving application 904 can be a time and resource consuming process of testing all compression methods on each data file in the set of data files 906, the results of the compression testing specifying the optimal compression methods to apply to each data file are stored in compression cache 914 for reuse. Thus, during a subsequent invocation of the local archiving application 904, if the same or similar file (based on a threshold such as file size, edit date, etc.) is archived, the compression method deemed optimal from the previous operation may be selected from compression cache 914.

After compression is completed for the set of data files 906, meta data 918 describing the compression methods and associated file types may in turn be uploaded to archive meta data service 902. Archive meta data service 902 may then in turn update its configuration file (e.g., configuration file 718 in FIG. 7) with this new compression method information, such that subsequent requests to archive meta data service 902 for optimal compression methods recommendations are affected by the data uploaded.

Figure 10:
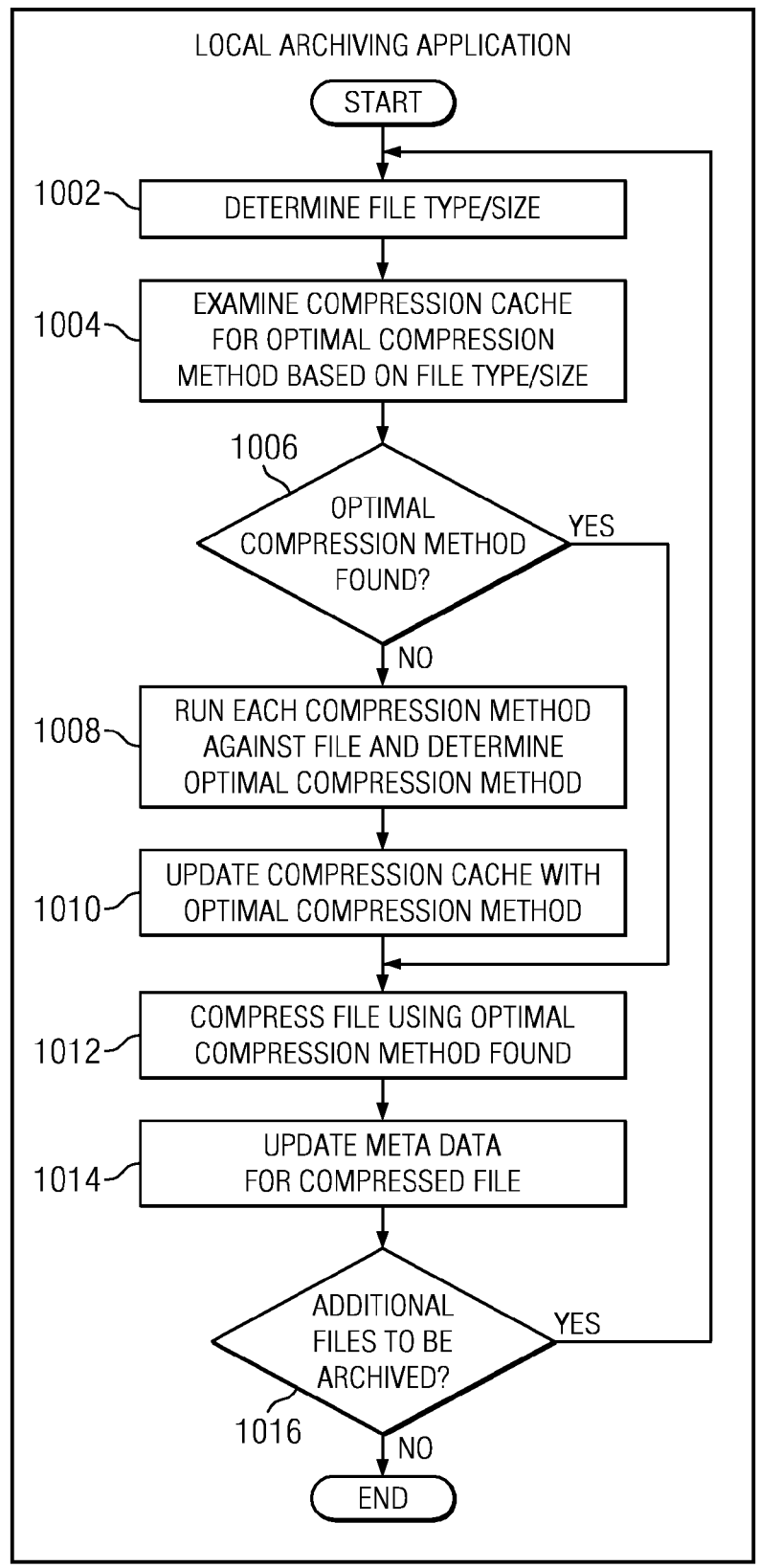
FIG. 10 is a flowchart of a local exhaustive analysis archive process implemented locally by an archive application for compressing a set of files into an archive file in accordance with the illustrative embodiments.

FIG. 10 is a flowchart of a local exhaustive analysis archive process implemented locally by an archive application for compressing a set of files into an archive file in accordance with the illustrative embodiments. The archive process described in FIG. 10 may be implemented in computer 900 in FIG. 9. Specifically, the process is performed by local archiving application 904 in FIG. 9 on each file in the set of files to be stored as a single archive.

When an instruction is received to archive a set of files, the process begins with the local archiving application determining the type and size of a first file in the set of files (step 1002). Any known technique for determining the type and size of a file may be used to obtain the file type and size, such as the "file" and "file size" commands in UNIX.

Once the type and size of the file has been determined, the local archiving application examines the compression cache for an optimal compression method for the determined file type and size (step 1004). A determination is made as to whether the optimal compression method already exists in the compression cache for the specified file type and size (step 1006). If an optimal compression method for the file type and size is found in the compression cache ('yes' output of step 1006), the process continues to step 1012. However, if an optimal compression method for the file type and size is not found in the compression cache ('no' output of step 1006), the local archiving application performs the exhaustive analysis by running each compression method available against the first file, comparing the results of each compression of the file, and making a determination as to the method that provides the optimal compression for the file (step 1008). The local archiving application then updates the compression cache by creating an entry associated with the file in the cache (step 1010). The file entry specifies the attributes of the file and the optimal compression method determined from the analysis performed by the local archiving application.

The local archiving application then compresses the file using the optimal compression method determined by the local archiving application (step 1012). The local archiving application also updates the meta data for the compressed file with the compression method used to compress the file (step 1014). The compression method used to compress the file is stored in the meta data to enable the local archiving application to determine which method to use to decompress the file at a later time.

A determination is then made by the local archiving application as to whether there are any more files in the set of files to be archived (step 1016). If the local archiving application determines that there are more files in the set to be archived ('yes' output of step 1016), the process returns to step 1002 to determine the file type and size of the next file to be archived. If all files in the set have been archived ('no' output of step 1016), the process terminates thereafter.

Figure 11:
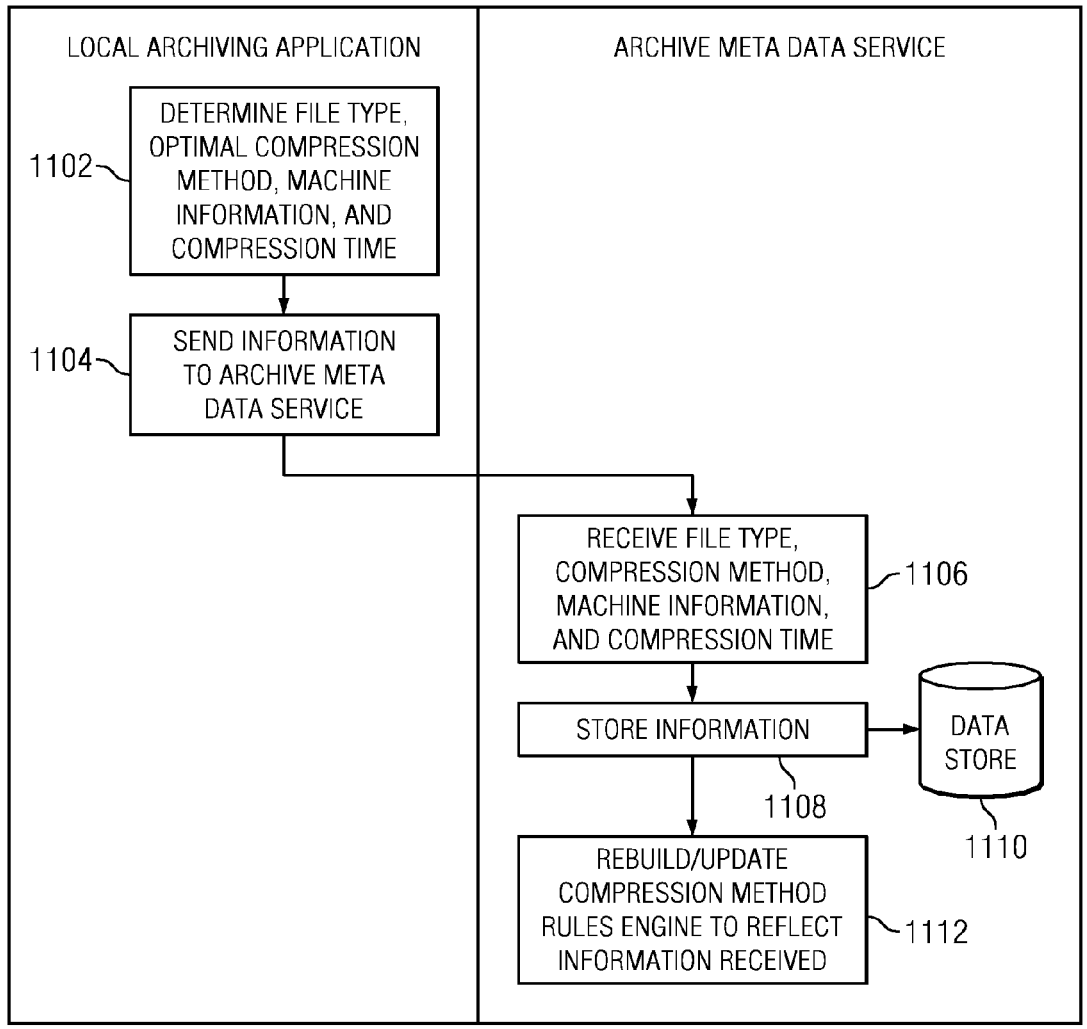
FIG. 11 is a flowchart of a feedback process for updating historical compression data in accordance with the illustrative embodiments.

FIG. 11 is a flowchart of a feedback process for updating historical compression data in accordance with the illustrative embodiments. The feedback process described in FIG. 11 may be implemented by local archiving application 904 in FIG. 9 which provides compression information and machine information feedback to the archive meta data service. After compression is completed, the meta-data describing the compression method selected for a file type may in turn be uploaded to this service. The compression information and machine information is used to rebuild/update the compression method rules engine in the archive meta data service, such that subsequent requests to the service for recommendations for an optimal compression method for archiving a file are affected by the uploaded data.

The process begins with a local archiving application determining the type of a data file, the optimal compression method for the data file, machine information about the computer device used to compress the data file, and the compression time (step 1102). The local archiving application may be local archiving application 904 in FIG. 9 which performs the exhaustive analysis method of running all available compression methods against each data file in a set of data files to be archived and uploading the selected compression methods to an archive meta data service. Optimal compression method information may include the attributes (e.g., file type and size) of a compressed data file and the compression method determined by the local archiving application to be the optimal compression method for the data file.

Machine information may comprise information about the computer device on which the local archiving application runs, such as, for example, the CPU architecture, processor speed of the device, read/write speed of the device, or the type of hard drive (e.g., solid state drives (SSD), serial ATA (SATA) drives). Machine information may be used to determine the "compression power" of the computer and specify benchmarks or performance thresholds of the computer performing compressions. These benchmark numbers for a computer may be uploaded with each compression to the archive meta data service, along with the time it took to compress each file and its size. The archive meta data service may use this machine information to recommend optimal compression methods for a data file not only based on the file type and size, but also on the processor speed and read/write speed (among others) of the computer performing the compressions based on computers of similar compression speed.

Compression time comprises a maximum time in which the file should be compressed. The maximum compression time setting for creating an archive file from a set of data files may be arbitrary, such as range of integers 0 to 9, or specified by a user. In either case, the selection of compression methods may be made based on processor or read/write speed or the compression time option. For example, if a user requests to compress 200 files into a single archive and also requests the compression take no longer than 1 minute, the method and method options selected to compress each file are based on historical data stored within the proposed service for computers of similar compression speed. It should be noted that although the compression method information, machine information, and compression time are illustrated as being uploaded in the same process, the upload of this information may be implemented as separate, optional actions.

The local archiving application sends the file type, compression method, maximum compression time for the file, and the machine information to the archive meta data service (step 1104). The archive meta data service receives the file type, compression method, machine information, and the maximum compression time from the local archiving application (step 1106). The archive meta data service stores the information (step 1108) received in data store (step 1110).

The archive meta data service also rebuilds or updates its compression method rules engine to reflect the information received (step 1112). The rebuilt/updated rules engine may be used in subsequent archive requests, such as from the embodiments shown in FIGS. 3 and 7.

The flowchart and block diagrams in the Figures illustrate the architecture, functionality, and operation of possible implementations of systems, methods and computer program products according to various embodiments of the disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the aspects of the disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the aspects of the disclosure for various embodiments with various modifications as are suited to the particular use contemplated.

The aspects of the disclosure can take the form of an entirely hardware embodiment, an entirely software embodiment or an embodiment containing both hardware and software elements. In a preferred embodiment, the aspects of the disclosure are implemented in software, which includes but is not limited to firmware, resident software, microcode, etc.

Furthermore, the aspects of the disclosure can take the form of a computer program product accessible from a computer-usable or computer-readable medium providing program code for use by or in connection with a computer or any instruction execution system. For the purposes of this description, a computer-usable or computer readable medium can be any tangible apparatus that can store the program for use by or in connection with the instruction execution system, apparatus, or device.

The medium can be an electronic, magnetic, optical, or semiconductor system (or apparatus or device). Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the aspects of the disclosure has been presented for purposes of illustration and description, and is not intended to be exhaustive or limited to the disclosure in the form disclosed. Many modifications and variations will be apparent to those of ordinary skill in the art. The embodiment was chosen and described in order to best explain the principles of the aspects of the disclosure, the practical application, and to enable others of ordinary skill in the art to understand the aspects of the disclosure for various embodiments with various modifications as are suited to the particular use contemplated.

What is claimed is:

1. A method for determining an optimal compression technique for each data file in a set of data files when creating an archive of the set of data files, the method comprising the steps of:

responsive to receiving an instruction to archive the set of data files, for each data file of the set of data files:

a computer determining a file type and a file size of the data file;

the computer selecting an optimal compression utility for the data file based on the file type and the file size of the data file, wherein the computer selecting the optimal compression utility for the data file based on the file type and the file size of the data file further comprises the steps of:

the computer sending, using a local archiving application, the file type and the file size of the data file to an archive meta data service, wherein the archive meta data service selects the optimal compression utility for the data file based on the file type and the file size of the data file by:

responsive to receiving the file type and the file size from the computer, querying, by the archive meta data service, a configuration file for an entry matching the file type and the file size of the data file, wherein the configuration file comprises historical compression information from a plurality of subscribing client archive applications; and sending, by the archive meta data service, a recommendation to the local archiving application recommending the optimal compression utility, wherein the optical compression utility is specified in the entry matching the file type and the file size of the data file; and the computer compressing the data file using the optimal compression utility to form a compressed data file;

the computer creating an archive file that includes the compressed data file for each data file of the set of data files; and the computer storing meta data in the archive file, wherein the meta data includes, for each data file of the set of data files, a meta compression format identifier that identifies the optimal compression utility used to compress the data file.

2. The method of claim 1, further comprising the steps of:
responsive to receiving an instruction to decompress a compressed data file in the archive file, the computer examining a meta compression format identifier in the meta data to determine the optimal compression utility used to compress the compressed data file; and
the computer decompressing the compressed data file using the optimal compression utility.

3. The method of claim 1, further comprising the steps of:
responsive to the computer receiving, using the local archiving application, the recommendation for the optimal compression utility, the computer determining that the recommended optimal compression utility does not exist locally; and
the computer retrieving the recommended optimal compression utility from the archive meta data service.

4. The method of claim 1, further comprising the steps of:
the computer obtaining machine information about a computing device used to compress a data file in the set of data files; and
the computer sending the file type of the data file, the optimal compression utility, and the machine information to an archive meta data service, wherein the file type, the optimal compression utility, and the machine information are used by the archive meta data service in determining a new optimal compression utility to recommend in subsequent archive requests.

5. The method of claim 4, further comprising the steps of:
the computer obtaining a compression time specifying a maximum time for compressing the data file; and
the computer sending the compression time to the archive meta data service, wherein the compression time is used by the archive meta data service in determining the new optimal compression utility to recommend in subsequent archive requests.

6. The method of claim 5, wherein the compression time is user-defined.

7. The method of claim 4, wherein the machine information comprises at least one of processor speed, read/write speed, hard drive type, and CPU architecture of the computing device.

8. The method of claim 1, wherein the selected optimal compression utility for each data file in the set of data files provides a fastest compression time, requires a least amount of storage space required, and requires a least amount of bandwidth required for compressing the data file.

9. The method of claim 1, wherein the computer determining, the computer selecting, the computer compressing, and the computer storing steps are performed by a local archiving application of the computer, and wherein selection of the optimal compression utility for each data file in the set of data files is based on the file type and the file size of the data file and local environment in which the local archiving application is run.

10. A computer program product for determining an optimal compression technique for each data file in a set of data files when creating an archive of the set of data files, the computer program product comprising:

one or more computer-readable tangible storage devices;
program instructions, stored on at least one of the one or more storage devices, responsive to receiving an instruction to archive the set of data files, to, for each data file of the set of data files:
determine a file type and a file size of the data file;
select an optimal compression utility for the data file based on the file type and the file size of the data file, wherein the program instructions to select the optimal compression utility for the data file based on the file type and the file size of the data file further comprise:

program instructions to send, using a local archiving application, the file type and the file size of the data file to an archive meta data service, wherein the archive meta data service selects the optimal compression utility for the data file based on the file type and the file size of the data file by:

in response to receiving the file type and the file size at the archive meta data service, querying, by the archive meta data service, a configuration file for an entry matching the file type and the file size of the data file, wherein the configuration file comprises historical compression information from a plurality of subscribing client archive applications; and sending, by the archive meta data service, a recommendation to the local archiving application recommending the optimal compression utility, wherein the optimal compression utility is specified in the entry matching the file type and the file size of the data file; and compress the data file using the optimal compression utility to form a compressed data file;

program instructions, stored on at least one of the one or more storage devices, to create an archive file that includes the compressed data file for each data file of the set of data files; and program instructions, stored on at least one of the one or more storage devices, to store meta data in the archive file, wherein the meta data includes, for each data file of the set of data files, a meta compression format identifier that identifies the optimal compression utility used to compress the data file.

11. The computer program product of claim 10, further comprising:
program instructions, stored on at least one of the one or more storage devices, responsive to receiving an instruction to decompress a compressed data file in the archive file, to examine a meta compression format identifier in the meta data to determine the optimal compression utility used to compress the compressed data file; and
program instructions, stored on at least one of the one or more storage devices, to decompress the compressed data file using the optimal compression utility.

12. The computer program product of claim 10, further comprising:
program instructions, stored on at least one of the one or more storage devices, responsive to receiving, using the local archiving application, the recommendation for the optimal compression utility, to determine that the recommended optimal compression utility does not exist locally; and
program instructions, stored on at least one of the one or more storage devices, to retrieve the recommended optimal compression utility from the archive meta data service.

13. The computer program product of claim 10, further comprising:
program instructions, stored on at least one of the one or more storage devices, to obtain machine information about a computing device used to compress a data file in the set of data files; and
program instructions, stored on at least one of the one or more storage devices, to send the file type of the data file, the optimal compression utility, and the machine information to an archive meta data service, wherein the file type, the optimal compression utility, and the machine information are used by the archive meta data service in determining a new optimal compression utility to recommend in subsequent archive requests.

14. A computer system comprising:
one or more processors, one or more computer-readable memories and one or more computer-readable tangible storage devices;
program instructions, stored on at least one of the one or more storage devices for execution by at least one of the one or more processors via at least one of the one or more memories, responsive to receiving an instruction to archive a set of data files, to, for each data file of the set of data files:
determine a file type and a file size of the data file;
select an optimal compression utility for the data file based on the file type and the file size of the data file, wherein the program instructions to select the optimal compression utility for the data file based on the file type and the file size of the data file further comprise:
program instructions to send, using a local archiving application, the file type and the file size of the data file to an archive meta data service, wherein the archive meta data service selects the optimal compression utility for the data file based on the file type and the file size of the data file by:
in response to receiving the file type and the file size at the archive meta data service, querying, by the archive meta data service, a configuration file for an entry matching the file type and the file size of the data file, wherein the configuration file comprises historical compression information from a plurality of subscribing client archive applications; and
sending, by the archive meta data service, a recommendation to the local archiving application recommending the optimal compression utility, wherein the optimal compression utility is specified in the entry matching the file type and the file size of the data file; and
compress the data file using the optimal compression utility to form a compressed data file;
program instructions, stored on at least one of the one or more storage devices for execution by at least one of the one or more processors via at least one of the one or more memories, to create an archive file that includes the compressed data file for each data file of the set of data files; and
program instructions, stored on at least one of the one or more storage devices for execution by at least one of the one or more processors via at least one of the one or more memories, to store meta data in the archive file, wherein the meta data includes, for each data file of the set of data files, a meta compression format identifier that identifies the optimal compression utility used to compress the data file.

* * * * *